(12) United States Patent
Deng et al.

(10) Patent No.: US 11,569,122 B2
(45) Date of Patent: *Jan. 31, 2023

(54) METHODS AND APPARATUS FOR CLEAVING OF SEMICONDUCTOR SUBSTRATES

(71) Applicant: APPLIED MATERIALS, INC., Santa Clara, CA (US)

(72) Inventors: Felix Deng, Singapore (SG); Yueh Sheng Ow, Singapore (SG); Tuck Foong Koh, Singapore (SG); Nuno Yen-Chu Chen, Singapore (SG); Yuichi Wada, Chiba (JP); Sree Rangasai V. Kesapragada, Union City, CA (US); Clinton Goh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/217,179

(22) Filed: Mar. 30, 2021

(65) Prior Publication Data

US 2021/0217656 A1 Jul. 15, 2021

Related U.S. Application Data

(63) Continuation of application No. 16/403,796, filed on May 6, 2019, now Pat. No. 10,991,617.

(Continued)

(51) Int. Cl.
  *H01L 21/762* (2006.01)
  *H01L 21/67* (2006.01)
(52) U.S. Cl.
  CPC .. *H01L 21/76254* (2013.01); *H01L 21/67017* (2013.01); *H01L 21/67115* (2013.01); *H01L 21/67253* (2013.01)

(58) Field of Classification Search
  None
  See application file for complete search history.

(56) References Cited

U.S. PATENT DOCUMENTS

| 4,230,924 A | 10/1980 | Brastad et al. |
| 5,738,915 A | 4/1998 | Fathi et al. |

(Continued)

FOREIGN PATENT DOCUMENTS

| CN | 204991659 | 1/2016 |
| KR | 10-2011-0063452 A | 6/2011 |

OTHER PUBLICATIONS

International Search Report for PCT/US2019/031120, dated Aug. 23, 2019.

(Continued)

*Primary Examiner* — Ali Naraghi
(74) *Attorney, Agent, or Firm* — Moser Taboada

(57) ABSTRACT

Methods and apparatus for cleaving a substrate in a semiconductor chamber. The semiconductor chamber pressure is adjusted to a process pressure, a substrate is then heated to a nucleation temperature of ions implanted in the substrate, the temperature of the substrate is then adjusted below the nucleation temperature of the ions, and the temperature is maintained until cleaving of the substrate occurs. Microwaves may be used to provide heating of the substrate for the processes. A cleaving sensor may be used for detection of successful cleaving by detecting pressure changes, acoustic emissions, changes within the substrate, and/or residual gases given off by the implanted ions when the cleaving occurs.

20 Claims, 3 Drawing Sheets

Related U.S. Application Data

(60) Provisional application No. 62/671,535, filed on May 15, 2018.

(56) References Cited

U.S. PATENT DOCUMENTS

| | | | |
|---|---|---|---|
| 5,882,987 | A | 3/1999 | Srikrishnan |
| 6,190,998 | B1 * | 2/2001 | Bruel ................ H01L 21/76254 |
| | | | 438/455 |
| 6,291,313 | B1 | 9/2001 | Henley et al. |
| 6,387,829 | B1 | 5/2002 | Usenko et al. |
| 6,486,008 | B1 * | 11/2002 | Lee ................... H01L 21/76254 |
| | | | 438/149 |
| 6,805,808 | B2 | 10/2004 | Fuji et al. |
| 6,969,668 | B1 | 11/2005 | Kang et al. |
| 9,536,741 | B2 | 1/2017 | Agraffeil |
| 10,679,908 | B2 * | 6/2020 | Kayser ............... H01L 21/7806 |
| 10,991,617 | B2 * | 4/2021 | Deng ................ H01L 21/67253 |
| 2003/0134489 | A1 | 7/2003 | Schwarzenbach et al. |
| 2006/0272772 | A1 | 12/2006 | Al-Bayati et al. |
| 2009/0050901 | A1 * | 2/2009 | Gadkaree ............ H01L 21/2007 |
| | | | 257/77 |
| 2009/0209084 | A1 | 8/2009 | Nunan et al. |
| 2010/0112780 | A1 | 5/2010 | Thompson et al. |
| 2010/0127343 | A1 * | 5/2010 | Daigler ............. H01L 21/76254 |
| | | | 257/E21.568 |
| 2012/0077289 | A1 | 3/2012 | Henley |
| 2013/0203261 | A1 | 8/2013 | Zhao et al. |
| 2014/0319129 | A1 | 10/2014 | Ahmad |
| 2016/0056068 | A1 | 2/2016 | Hu et al. |
| 2016/0276522 | A1 | 9/2016 | Henley et al. |
| 2017/0069717 | A1 | 3/2017 | Linthicum et al. |
| 2017/0117146 | A1 | 4/2017 | Wong et al. |
| 2019/0326160 | A1 | 10/2019 | Li |

OTHER PUBLICATIONS

Analysis of Eddy—Current Losses Over Conductive Substrates with Applications to Monolithic Inductors and Transformers Ali M. Niknejad, Member, IEEE, and Robert G. Meyer, Fellow, IEEE, IEEE Transactions on Microwave Theory and Techniques, vol. 49, No. 1, Jan. 2001.

* cited by examiner

METHODS AND APPARATUS FOR
CLEAVING OF SEMICONDUCTOR
SUBSTRATES

CROSS-REFERENCE TO RELATED APPLICATIONS

This application is a continuation of co-pending U.S. patent application Ser. No. 16/403,796, filed May 6, 2019, which claims benefit of U.S. provisional patent application Ser. No. 62/671,535, filed May 15, 2018. Each of the aforementioned related patent applications is herein incorporated by reference in their entirety.

FIELD

Embodiments of the present principles generally relate to semiconductor processing.

BACKGROUND

Silicon on insulator (SOI) technology incorporates an insulating layer between a silicon layer and a silicon substrate which helps to prevent parasitic device capacitance, reducing leakage currents and improving power consumption. SOI technology also allows for increased miniaturization of the electronic devices, yielding higher device densities. The manufacturing of SOI substrates is generally compatible with conventional fabrication processes but some techniques, such as wafer bonding, require splitting or cleaving of a substrate during the processing. The insulating layer is created by bonding oxidized silicon onto another substrate and then removing a portion of the second substrate through a cleaving process which splits the second substrate horizontally. The inventors have observed that the cleaving process may produce very rough surfaces and other defects after the substrate is split.

Thus, the inventors have provided improved methods and apparatus for cleaving semiconductor substrates.

SUMMARY

Methods and apparatus provide microwave cleaving of semiconductor substrates.

In some embodiments, a method of cleaving a substrate in a chamber comprises adjusting a pressure of the chamber to a process pressure; adjusting a temperature of the substrate to a nucleation temperature of ions implanted in the substrate; adjusting the temperature of the substrate below the nucleation temperature of the ions implanted in the substrate; and maintaining the temperature of the substrate at a soak temperature until cleaving of the substrate occurs.

In some embodiments, the method further includes adjusting the temperature of the substrate using microwaves at a fixed power level; adjusting the temperature of the substrate using microwaves controlled by a proportional-integral-derivative (PID) controller interfacing with an infrared sensor; adjusting the temperature of the substrate using microwaves with a power level adjusted before, after, or in parallel with a change of the process pressure in the chamber; wherein the power level of the microwaves is in a range of approximately 0 watts to approximately 1600 watts; adjusting the temperature of the substrate using microwaves with a single frequency or a sweeping frequency; wherein the sweeping frequency has a range of approximately 2 GHz to approximately 8 GHz; wherein the sweeping frequency has a range of approximately 5.85 GHz to approximately 6.65 GHz; adjusting the temperature of the substrate to the nucleation temperature with a ramping rate of approximately 0.01 degrees Celsius to approximately 15 degrees Celsius; pulsing the soak temperature while maintaining the process pressure in the chamber to promote cleaving of the substrate; pulsing the process pressure in the chamber while maintaining the soak temperature to promote cleaving of the substrate; adjusting the process pressure of the chamber to a range of approximately 0 Torr to approximately 770 Torr; and/or wherein the ions implanted in the substrate include hydrogen, helium, nitrogen, oxygen, or argon.

In some embodiments, a method of cleaving a substrate in a chamber comprises adjusting a pressure of the chamber to a process pressure; adjusting a temperature of the substrate to a nucleation temperature of ions implanted in the substrate using fast sweeping microwaves (FSM); adjusting the temperature of the substrate below the nucleation temperature of the ions implanted in the substrate using FSM; maintaining the temperature of the substrate at a soak temperature; and detecting when cleaving of the substrate has occurred.

In some embodiments, the method further includes using FSM with a frequency range of approximately 5.85 GHz to approximately 6.65 GHz; sweeping the frequency range at a rate of approximately 750 microseconds between frequencies to approximately 25 microseconds between frequencies; and/or detecting the cleaving of the substrate by a change in a pressure of the chamber, by an acoustic emission, or by a presence of a residual gas associated with the ions implanted in the substrate.

In some embodiments, an apparatus for cleaving a substrate comprises a chamber for processing the substrate; a microwave power source coupled to a multi-faceted microwave cavity for heating the substrate during processing; a controller with proportional-integral-derivative (PID) control for adjusting the microwave power source and process pressure within the chamber; a vacuum source with pulsing capabilities to pulse the process pressure within the chamber; and a contactless temperature sensor that reads a temperature of the substrate during processing and relays the temperature to the PID controls.

In some embodiments, the apparatus further includes a cleaving sensor for detecting when a cleaving of the substrate has occurred and/or wherein the cleaving sensor includes an acoustic emission sensor, a residual gas analyzer, or a pressure sensor.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
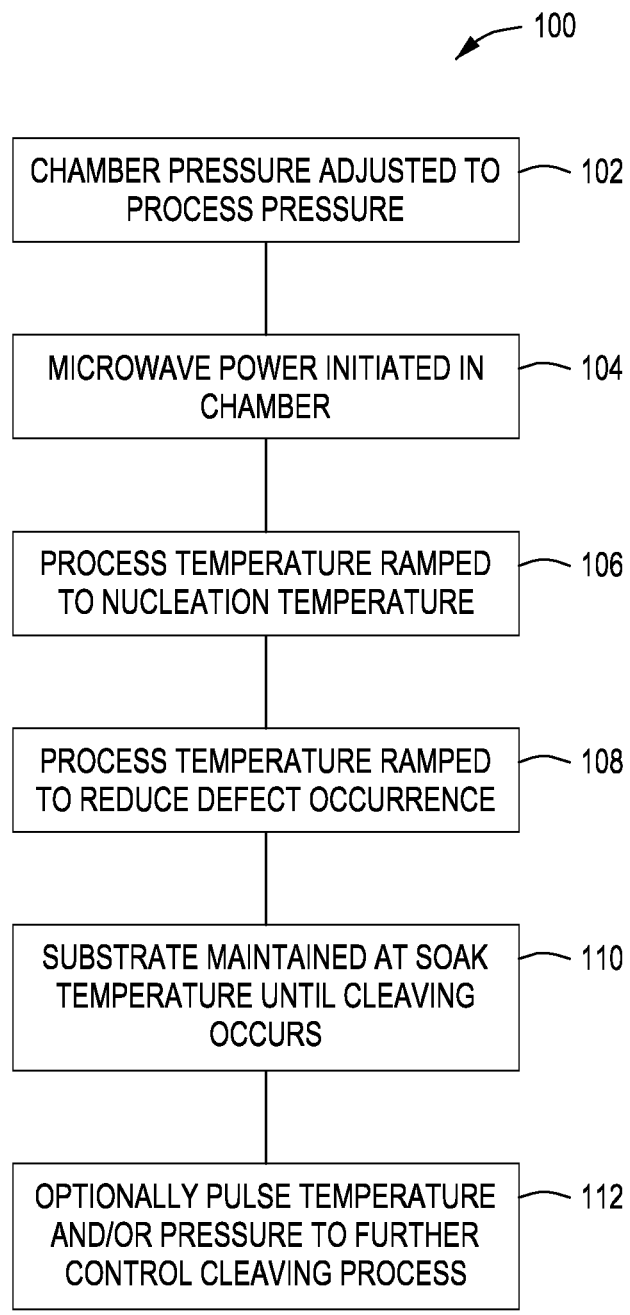
FIG. 1 depicts a method of cleaving a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide an enhanced cleaving technique for silicon-on-insulator (SOI) substrates. An application of fast sweeping microwaves (FSM) advantageously enables a controlled nucleation of blisters formed by implanted ions in the substrate. Higher microwave and temperature uniformity enables uniform growth of the blisters for more uniform cleaving, beneficially avoiding cleaving defects caused by, for example, non-uniform cavitation or cross-plane cleavage. The optional pulsing of temperatures and/or pressures during the cleaving processes advantageously provides for additional driving forces to cleave substrates. By using a proportional-integral-derivative (PID) controller along with non-contact temperature measurement, a precise process control over power pulsing, temperature, and heating and/or cooling rates during the cleaving process may be advantageously obtained. By using vacuum-compatible hardware, an accurate detection of a successful cleave may be beneficially achieved with, for example, a residual gas analyzer (RGA) and/or a pressure detector.

For the sake of brevity, some example embodiments that follow may pertain to processing a single substrate. However, the methods and apparatus of the present principles also apply to processing multiple substrates (batch processing).

Figure 2:
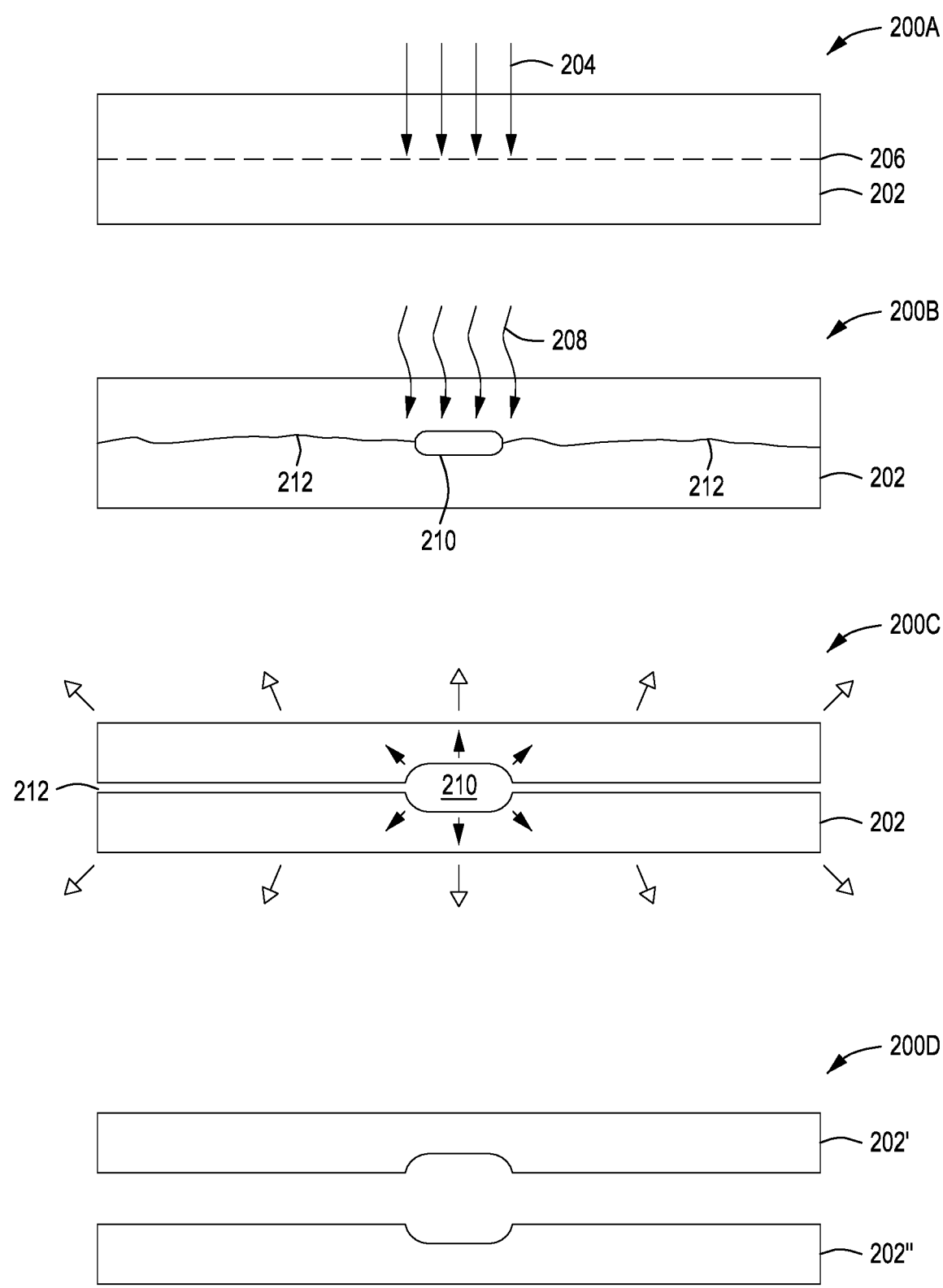
FIG. 2 depicts a cross-sectional view of substrate undergoing the method of FIG. 1 in accordance with some embodiments of the present principles.
Figure 3:
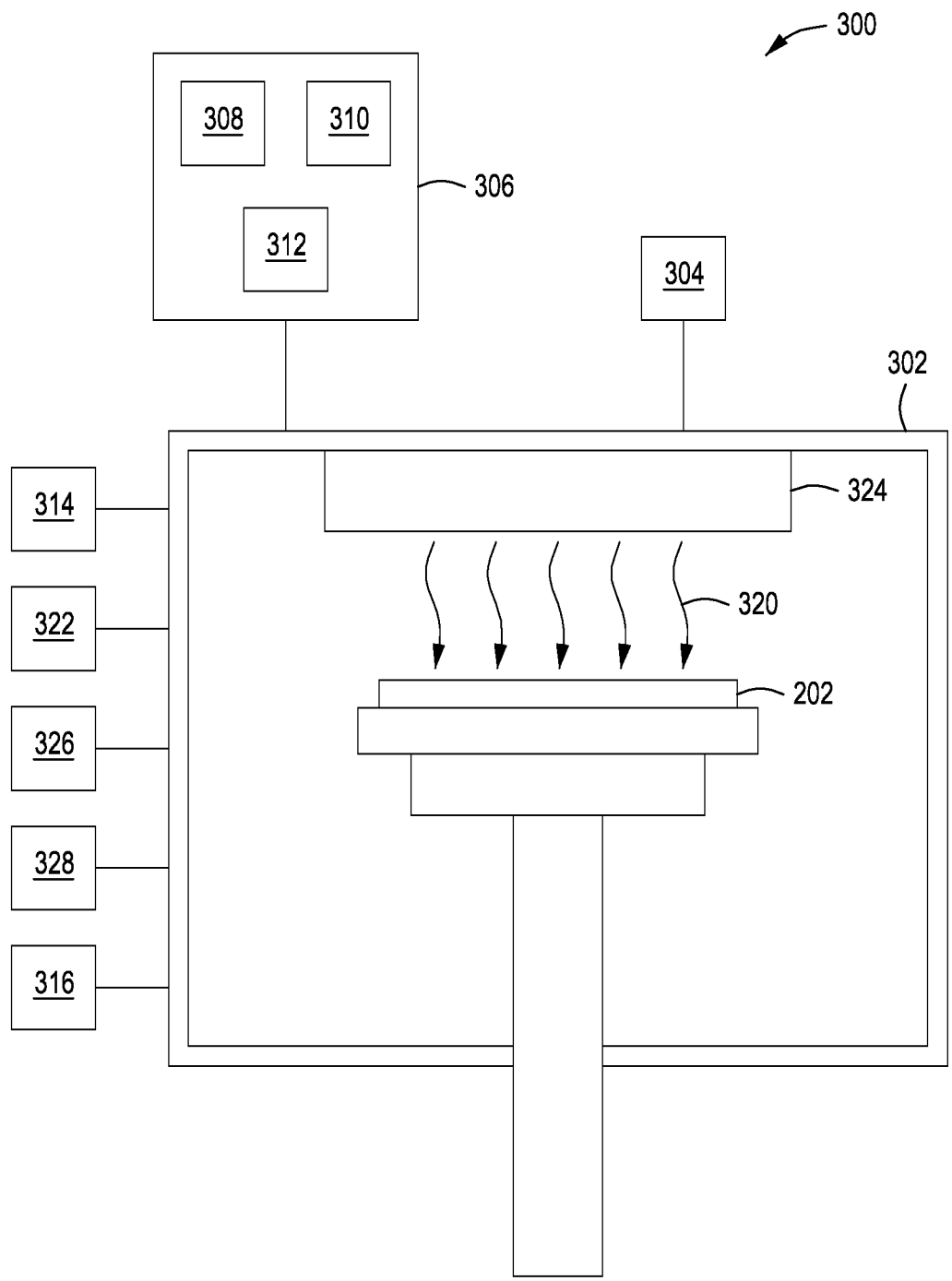
FIG. 3 depicts a processing system in which a method of cleaving a substrate may be performed in accordance with some embodiments of the present principles.

In FIG. 1, a method 100 of cleaving a substrate in accordance with some embodiments is illustrated. In block 102, the method 100 adjusts a chamber pressure to a process pressure. In some embodiments, the process pressure is less than atmospheric pressure, and a chamber 302 of a processing system 300, for example as illustrated in FIG. 3, is pumped down to the process pressure by applying a vacuum source 316 to the chamber 302. In some embodiments, the process pressure may range from approximately 0 Torr to approximately 770 Torr. A substrate 202 shown in FIG. 2 in the chamber has undergone a prior ion implantation process 204 to inject the substrate with ions from gases such as hydrogen, argon, oxygen, nitrogen, and/or helium and the like. The ions are injected in a layer at a specific depth 206 (dashed line) of the substrate 202 that is to be cleaved as illustrated, for example, in an ion implantation view 200A of FIG. 2. For the sake of brevity, a hydrogen ion implantation is used as an example ion implantation in example embodiments described below but is not meant to limit the methods of the present principles.

In block 104, microwave power is initiated into the chamber. In some embodiments, the microwave power may be provided by a microwave power source 304 that produces microwaves 320 into the chamber 302 as illustrated, for example, in FIG. 3. In some embodiments, the microwave power source 304 may be coupled to a microwave cavity 324. In some embodiments, the microwave cavity 324 may be a single mode cavity or a multi-mode cavity. In some embodiments, the microwave power source 304 may be operated at a single power level (fixed-power mode) or at more than one power levels (PID control mode) for a given process. The PID control mode may be implemented in a process controller 306 shown, for example, in FIG. 3. The process controller 306 may include a memory 308, a central processing unit (CPU) 310, and supporting circuits 312. The process controller 306 oversees processes within the process system 300. In some embodiments, the microwaves 320 may cause dipole molecules to rotate, causing heating in the substrates. The PID control mode allows fine incremental temperature changes by controlling the excitation of the dipole molecules into rotation. The PID control mode uses feedback to control the microwave power and, subsequently, the heating of the substrate. The microwave power may also be varied before, after, or in parallel with pressure changes in the chamber 302. In some embodiments, the microwaves 320 may also induce eddy currents in the substrate. The eddy currents create an induction type heating directly within the substrate. Imperfections or defects in the crystal lattice of the substrates may also result in internal substrate heating. In some embodiments, the cleave interface may contain such imperfections or defects which may result in additional heat generated directly at the cleave interface, aiding the cleaving of the substrate. In some embodiments, the ion implantation and/or irradiation creates the interfacial imperfections or defects within the substrate that subsequently generate heat during processing and assist in cleaving the substrate.

In some embodiments, the microwave power may be pulsed at varying power levels and/or at varying times. In some embodiments, the power levels of the pulses may be cyclical. In some embodiments, the power levels and sequences of the pulses may vary over time. In some embodiments, the power level may have a range of between approximately 0 watts to approximately 1600 watts for a single substrate. In some embodiments, the power levels may range from approximately 0 watts to approximately 1600 watts or higher. The power level range is adjusted to support heating of the substrates to the processing temperatures and will depend on, for example, the number of substrates being processed, the ramping rate of the temperatures, and/or the size of the chamber. Substrates may also be processed in batches of more than one substrate. Batch processing may include, for example, up to 100 substrates or more, and the power level range is adjusted accordingly to provide sufficient power for the heating of the batch of substrates.

The frequency of the microwave power may be a single frequency or a sweeping frequency (FSM). In some embodiments, a microwave susceptor ring may be used around the substrate to improve microwave uniformity and redirect microwaves on the substrates. The volumetric heating from the microwave power also enables tuning of cooling rates in conjunction with the PID control mode. In some embodiments, an infrared heat source may be used in addition to the microwave power to improve thermal uniformity of the substrate. In some embodiments, heating of the substrate is in a range of approximately 0 degrees Celsius (C) to approximately 500 degrees C. In some embodiments, heating of the substrate is in a range of approximately 0 degrees Celsius (C) to approximately 500 degrees C. or higher.

FSM enables a more uniform distribution of standing waves within a microwave cavity, allowing a higher degree of uniform temperature control of a substrate. The swept frequency may include a continuous sweep of frequencies in a range of frequencies and/or a sweep of discretized frequencies within the range of frequencies. The sweep of the frequencies may be from a lower frequency to a higher frequency and back down to the lower frequency or vice versa. The sweep may also be over a range of frequencies from a starting frequency to an ending frequency and then repeating from the starting frequency to the ending frequency. In some embodiments, the frequency range may be from approximately 2 GHz to approximately 8 GHz with continuous or discretized intermediate frequencies. In some embodiments, the frequency range may be from approximately 5.85 GHz to approximately 6.65 GHz. In some embodiments, the frequency range may be divided into discretized frequencies of 4,096 frequencies with a frequency separation of approximately 260 Hz. The sweep rate of the FSM may be varied depending on the application of a process. The sweep rate may range from approximately 750 microseconds between frequencies to approximately 25 microseconds between frequencies. The FSM enables activation (heating and blistering) of ions implanted into the substrate in an SOI application. The ions are implanted into the substrate at a specific depth where splitting of the substrate is to occur. The FSM activates the ions causing the substrate to cleave.

In block 106, the process temperature is ramped to a nucleation temperature of the implanted ions. As illustrated, for example, in a nucleation view 200B of FIG. 2, microwaves 208 are transmitted to heat the implanted ions to start nucleation which forms a blister 210 and a crack 212 in the substrate 202. The microwaves 208 provide volumetric heating to the substrate 202. In some embodiments, the temperature may be ramped, for example, at a rate which ranges from approximately 0.01 degrees C. per second to approximately 15 degrees C. per second for a substrate. In some embodiments, the temperature may be ramped, for example, at a rate less than approximately 0.01 degrees C. per second to more than approximately 15 degrees C. per second. The ramp rate may be adjusted depending on, for example, the number of substrates being processed, the type of ion implantation in a substrate, and/or the material of the substrate and the like.

Nucleation can be a homogenous type or a heterogeneous type. A homogenous type nucleation occurs at temperatures above the nucleation temperature and creates spontaneous blisters. A heterogeneous type nucleation occurs at temperatures near the nucleation temperature and promotes growth of existing blisters. By controlling the process temperatures, the nucleation may be limited to a heterogeneous type to beneficially enhance the cleaving process. In some embodiments, the ramp rate may be facilitated by a temperature sensor 322 illustrated, for example, in FIG. 3. In some embodiments, the temperature sensor 322 may be a contactless temperature sensor such as, for example, an infrared (IR) sensor and the like. In some embodiments, the IR sensor may have high sensitivity and a quick response time and integrated with the PID control. The PID control allows faster response times and fine control of the heating and cooling ramp rates.

In block 108, the process temperature is ramped to reduce defect occurrence in the cleaved substrate. The inventors have found that by controlling the nucleation near the center of the implanted ions, cross-plane cleavage can be reduced. The inventors have also found that by promoting blister growth and crack propagation within the substrate, cavitation effects can be reduced. The controlled ramping of the process temperature enables a reduction in substrate defects caused during cleaving. The ramp rate may be adjusted depending on, for example, the number of substrates being processed, the type of ion implantation in a substrate, and/or the material of the substrate and the like.

In block 110, the substrate is maintained at a soak temperature until cleaving occurs. As shown, for example, in a cleaving view 200D of FIG. 2, the substrate 202 is cleaved into a first substrate 202' and a second substrate 202". The soak temperature promotes growth of the blisters in the substrate 202 over nucleation which reduces defects due to plane mismatching. In some embodiments, FSM is used to provide a uniform heating of the substrate 202. The FSM eliminates hotspots within the chamber 302 because the multiple microwave frequencies create different standing waves in the microwave cavity 324. The different standing waves create more uniform heating within the chamber 302. In some embodiments, a multifaceted cavity may be used as the microwave cavity 324. The multifaceted cavity promotes even higher orders of reflection and multiple microwave modes to further increase the heating uniformity of the substrate 202.

In block 112, the temperature and/or pressure in the chamber 302 may be optionally pulsed to further control the cleaving process. The pulsing enables additional driving forces due to higher instantaneous values. As depicted in an enhanced process view 200C of FIG. 2, the vacuum source 316 is used to pump down the pressure in the chamber 302 to further promote expansion of the blisters and cracking in the substrate 202. In some embodiments, the vacuum source 316 is a pulsing vacuum source that may increase pressures and/or decrease pressures within the chamber 302 for short or long durations. Forming the blisters within the substrate at a higher pressure (such as, for example, atmospheric pressure) and then lowering the chamber pressure causes the gas in the blisters to expand. In some embodiments, the optional pulsing involves oscillating values around a set point. In some embodiments, the optional pulsing may have varying individual values while maintaining an average value. In some embodiments, the temperature may be held constant (isothermal) while the pressure pulses. In some embodiments, the pressure may be held constant (isobaric) while the temperature pulses.

Detection of a successful cleave may terminate the processing of the substrate. In some embodiments, the detection of a successful cleaving process is provided by a cleaving sensor 314 shown, for example, in FIG. 3. In some embodiments, the cleaving sensor 314 may include an RGA that detects residual gases given off by the blisters (caused by nucleation of the implanted ions in the substrate) within the substrate when a successful cleaving has been achieved. The RGA is fluidly connected to the chamber 302. The chamber 302 is pumped down to create a vacuum within the chamber to remove any other residual gases. When the cleaving occurs, the escaping gases from the blisters registers on the RGA, indicating a successful cleaving has occurred. In some embodiments, the cleaving sensor 314 may include a pressure sensor that detects minute pressure changes within the chamber 302. The chamber 302 is pumped down to create a vacuum within the chamber to a specific value. When the cleaving occurs, the gases within the blisters escape and create small fluctuations of the pressure in the chamber 302 which the pressure sensor detects.

In some embodiments, the cleaving sensor 314 may include a surface acoustic wave (SAW) sensor. A SAW sensor bounces acoustic waves off of the substrate 202 to detect changes within the substrate 202 such as a successful cleave. In some embodiments, the cleaving sensor 314 may include an acoustic emission sensor. An acoustic emission sensor detects sound waves within the chamber 302. When a successful cleave is achieved, the cleaving is often accompanied with the formation of sound waves due to the popping of the substrate when cleaving occurs. The acoustic emission sensor detects the cleaving sounds and determines if the cleaving was successful. The cleaving sensor 314 may also be used as part of the interlock logic for preventing wafer handling/extraction when a cleaving process has not been successful. A different handling process may be invoked when the substrate 202 does not cleave.

The process system 300 may also include a plasma source 326 and/or a gas source 328 for use during substrate processing. The process system 300 may be utilized alone or as a processing module of an integrated semiconductor substrate processing system, or cluster tool, such as an ENDURA® integrated semiconductor substrate processing system, available from Applied Materials, Inc. of Santa Clara, Calif. The process system 300 may be a plasma vapor deposition (PVD) chamber such as the CHARGER™ Under Bump Metallization (UBM) PVD chamber also available from Applied Materials, Inc. Other process chambers and/or cluster tools may suitably be used as well.

While the foregoing is directed to embodiments of the present principles, other and further embodiments of the principles may be devised without departing from the basic scope thereof.

The invention claimed is:

1. A method of cleaving a substrate in a chamber, comprising:
    adjusting a pressure of the chamber to a process pressure;
    adjusting a temperature of the substrate to a nucleation temperature of ions implanted in the substrate;
    adjusting the temperature of the substrate below the nucleation temperature of ions implanted in the substrate; and
    maintaining the temperature of the substrate at a soak temperature until cleaving of the substrate occurs.

2. The method of claim 1, further comprising:
    adjusting the temperature of the substrate using microwaves at a fixed power level.

3. The method of claim 1, further comprising:
    adjusting the temperature of the substrate using microwaves controlled by a proportional-integral-derivative (PID) controller interfacing with an infrared sensor.

4. The method of claim 1, further comprising:
    adjusting the temperature of the substrate using microwaves with a power level adjusted before, after, or in parallel with a change of the process pressure in the chamber.

5. The method of claim 4, wherein the power level of the microwaves is in a range of greater than zero watts to approximately 1600 watts.

6. The method of claim 1, further comprising:
    adjusting the temperature of the substrate using microwaves with a single frequency or a sweeping frequency.

7. The method of claim 6, wherein the sweeping frequency has a range of approximately 2 GHz to approximately 8 GHz.

8. The method of claim 6, wherein the sweeping frequency has a range of approximately 5.85 GHz to approximately 6.65 GHz.

9. The method of claim 1, further comprising:
    adjusting the temperature of the substrate to the nucleation temperature of ions with a ramping rate of approximately 0.01 degrees Celsius to approximately 15 degrees Celsius.

10. The method of claim 1, further comprising:
    pulsing the soak temperature while maintaining the process pressure in the chamber to promote cleaving of the substrate.

11. The method of claim 1, further comprising:
    pulsing the process pressure in the chamber while maintaining the soak temperature to promote cleaving of the substrate.

12. The method of claim 1, further comprising:
    adjusting the process pressure of the chamber to a range of greater than zero Torr to approximately 770 Torr.

13. The method of claim 1, wherein ions implanted in the substrate include hydrogen, helium, nitrogen, oxygen, or argon.

14. A method of cleaving a substrate in a chamber, comprising:
    adjusting a pressure of the chamber to a process pressure;
    adjusting a temperature of the substrate to a nucleation temperature of ions implanted in the substrate using microwaves with a single frequency or a sweeping frequency;
    adjusting the temperature of the substrate below the nucleation temperature of ions implanted in the substrate using microwaves with a single frequency or a sweeping frequency;
    maintaining the temperature of the substrate at a soak temperature; and
    detecting when cleaving of the substrate has occurred.

15. The method of claim 14, further comprising:
    using microwaves with a frequency range of approximately 5.85 GHz to approximately 6.65 GHz.

16. The method of claim 15, further comprising:
    sweeping the frequency range at a rate of approximately 750 microseconds between frequencies to approximately 25 microseconds between frequencies.

17. The method of claim 14, further comprising:
    detecting the cleaving of the substrate by a change in a pressure of the chamber, by an acoustic emission, or by a presence of a residual gas associated with ions implanted in the substrate.

18. An apparatus for cleaving a substrate, comprising:
    a chamber configured to cleave the substrate;
    a microwave power source coupled to a multi-faceted microwave cavity, the microwave power source configured to heat the substrate during processing with microwaves of a single frequency or of a sweeping frequency in a range of approximately 2 GHz to approximately 8 GHz;
    a vacuum source with pulsing capabilities configured to pulse a process pressure within the chamber;
    a contactless temperature sensor that reads a temperature of the substrate during processing and relays the temperature to a controller; and
    the controller with proportional-integral-derivative (PID) control configured to adjust the temperature of the substrate with the microwave power source and adjust the process pressure within the chamber with the vacuum source, the controller configured to perform a substrate cleaving process including:
        adjusting the process pressure within the chamber;
        adjusting the temperature of the substrate to a nucleation temperature of ions implanted in the substrate;
        adjusting the temperature of the substrate below the nucleation temperature of ions implanted in the substrate; and
        maintaining the temperature of the substrate at a soak temperature until cleaving of the substrate occurs.

19. The apparatus of claim 18, further comprising:
    a cleaving sensor coupled to the controller and configured to detect when a cleaving of the substrate has occurred.

20. The apparatus of claim 19, wherein the cleaving sensor includes an acoustic emission sensor, a residual gas analyzer, or a pressure sensor.

* * * * *